United States Patent [19]

Torimaru

[11] Patent Number: 5,446,688
[45] Date of Patent: Aug. 29, 1995

[54] NON-VOLATILE SEMICONDUCTOR MEMORY DEVICE

[75] Inventor: Yasuo Torimaru, Nara, Japan

[73] Assignee: Sharp Kabushiki Kaisha, Osaka, Japan

[21] Appl. No.: 171,715

[22] Filed: Dec. 21, 1993

[30] Foreign Application Priority Data

Dec. 24, 1992 [JP] Japan .................................. 4-344923

[51] Int. Cl.⁶ ............................................. G11C 11/22
[52] U.S. Cl. ..................................... 365/145; 365/149
[58] Field of Search ................................ 365/145, 149

[56] References Cited

U.S. PATENT DOCUMENTS 4,709,350 11/1987 Nakagome et al. ..................... 365/45
4,935,896 6/1990 Matsumura et al. ................... 365/187

FOREIGN PATENT DOCUMENTS 3-212889 9/1991 Japan .
3-272086 12/1991 Japan .
3-272087 12/1991 Japan .

OTHER PUBLICATIONS

Eaton, S. S., et al., "A ferroelectric nonvolatile memory" *1988 IEEE International Solid-State Circuits Conference* (Feb. 18, 1988) pp. 130-131 and 329.

Okuyama, M., "Ferroelectric gate nonvolatile memory FET—MFS-FET" *Ferroelectric thin film integration technology* (Feb. 1992) pp. 261-268. A partial English translation is also enclosed.

*Primary Examiner*—Joseph A. Popek
*Assistant Examiner*—F. Niranjan
*Attorney, Agent, or Firm*—Morrison & Foerster

[57] ABSTRACT

A non-volatile semiconductor memory device, includes: a memory cell including an MOS transistor for reading, an MOS transistor for writing, and an MFS transistor provided with a gate having a ferroelectric film above a channel region, one of a drain and a source of the MFS transistor having a common electric potential; a bit line for writing, to which the gate of the MFS transistor is connected through the MOS transistor for writing, and to which multivalued data having at least three voltage levels or analog data is input; a bit line for reading, to which the other of the drain and the source of the MFS transistor is connected through the MOS transistor for reading, and from which multivalued data having at least three voltage levels or analog data is read; a word line for writing connected to a gate of the MOS transistor for writing; and a word line for reading connected to a gate of the MOS transistor for reading.

4 Claims, 7 Drawing Sheets

NON-VOLATILE SEMICONDUCTOR MEMORY DEVICE

BACKGROUND OF THE INVENTION

1. Field of the Invention

The present invention relates to a non-volatile semiconductor memory device for storing multivalued data or analog data, using a metal-ferroelectrics-semiconductor (MFS) transistor.

2. Description of the Related Art

Volatile semiconductor memory devices are disclosed in Japanese Laid-Open (Kokai) Patent Publication Nos. 3-212889, 3-272086, and 3-272087. In these semiconductor memory devices, stored data is lost upon the turnoff of a power switch.

There are non-volatile semiconductor memory devices in which stored data is held even upon the turnoff of a power switch. Examples of the non-volatile semiconductor memory devices include a mask read only memory (ROM), a programmable read only memory (PROM), an erasable programmable: read only memory (EPROM), an electrically erasable programmable read only memory (EEPROM), and a flash EEPROM. In the mask ROM, data is written in the course of the production of the mask ROM; therefore, a user cannot rewrite the thus stored data. In the PROM, a user can write data; however, the stored data cannot be rewritten. In the EPROM, EEPROM, and flash EEPROM, data can be rewritten, but the write speed is low.

Volatile semiconductor memory devices, such as a dynamic random access memory (DRAM) and a static RAM (SRAM), can be used as non-volatile semiconductor memory devices which are accessible at a high speed. In this case, a battery or the like should be used as a backup power supply for holding stored data.

In recent years, non-volatile rewritable semiconductor memory devices, which are accessible at a high speed and do not require a power supply for holding stored data, have been paid much attention to. Such semiconductor memory devices utilize residual polarization of a ferroelectric material.

One example of the above-mentioned semiconductor memory device is "A Ferroelectric Nonvolatile Memory" disclosed in "1988 IEEE ISSCC". This ferroelectric nonvolatile memory has a memory cell as shown in FIG. 10. The memory cell has a structure in which a capacitor C for storing data is connected to a word line W and a bit line B through a selective transistor Q. The capacitor C includes a ferroelectric material as an interelectrode insulator. Thus, this ferroelectric nonvolatile memory has the same structure as that of DRAMs except for the use of a ferroelectric material in the capacitor C. Such a memory cell as shown in FIG. 10 can be used as a conventional DRAM by polarizing the capacitor C to either a positive state or a negative state. On the other hand, such a memory cell can store data in a non-volatile manner utilizing residual polarization, when being applied with an inverted electric field exceeding the anti-electric field known as a coercive force of the ferroelectric material.

A non-volatile semiconductor memory device using a metal-ferroelectrics-semiconductor (MFS) transistor in each memory cell is described in "ferroelectric thin film integration technology", p. 261, published by Science Forum, Feb. 1992. As shown in FIG. 11, the MFS transistor is a metal oxide semiconductor (MOS) transistor which has a gate electrode 33 provided above a channel region 31 with a ferroelectric film 32 sandwiched therebetween. The MFS transistor can store data in a non-volatile manner, using residual polarization of the ferroelectric film 32.

The above-mentioned ferroelectric non-volatile semiconductor memory devices have the following disadvantages: Since only one bit can be stored at a time in each memory cell, multivalued data such as ternary data is converted to binary data so as to be stored and analog data is A/D converted to binary digital data so as to be stored. In the case where data is read, D/A conversion, etc. should be conducted.

For the above-mentioned reasons, conventional non-volatile semiconductor memory devices require a large memory capacity for storing image data and the like, which leads a memory system to be large and expensive.

SUMMARY OF THE INVENTION

The non-volatile semiconductor memory device of this invention, comprises:

a memory cell including am MOS transistor for reading, an MOS transistor for writing, and an MFS transistor provided with a gate having a ferroelectric film above a channel region, one of a drain and a source of the MFS transistor having a common electric potential;

a bit line for writing, to which the gate of the MFS transistor is connected through the MOS transistor for writing, and to which multivalued data having at least three voltage levels or analog data is input:

a bit line for reading, to which the other of the drain and the source of the MFS transistor is connected through the MOS transistor for reading, and from which multivalued data having at least three voltage levels or analog data is read;

a word line for writing connected to a gate of the MOB transistor for writing; and a word line for reading connected to a gate of the MOS transistor for reading.

According to another aspect of the present invention, a non-volatile semiconductor memory device, comprises:

a plurality of word lines for writing and a plurality of word lines for reading arranged in parallel with each other in a row direction;

a plurality of bit lines for writing, to which multivalued data having at least three voltage levels or analog data is input, and a plurality of bit lines for reading, from which multivalued data having at least three voltage levels or analog data is read, the plurality of bit lines for writing and the plurality of bit lines for reading being arranged in parallel with each other in a column direction;

row scanning means for successively activating the word lines for writing or the word lines for reading in the respective rows in an alternative manner:

column scanning means for successively connecting the bit lines for writing or the bit lines for reading in the respective columns to an input data line or an output data line, while any one of the word lines for writing or any one of the word lines for reading is activated by the row scanning means; and memory cells arranged in a matrix in each crossed portion of one pair of the word line for writing and the word line for reading and one pair of the bit line for writing, and the bit line for reading, wherein each of the memory cells has an MOS transistor for reading, an MOS transistor for writing, and an MFS transistor provided with a gate having a ferroelectric film above a channel region;

one of a drain and a source of the MFS transistor has a common electric potential;

the gate of the MFS transistor is connected to the corresponding bit line for writing through the MOS transistor for writing;

the other of the drain and the source of the MFS transistor is connected to the bit line for reading through the corresponding MOS transistor for reading;

a gate of the MOS transistor for writing is connected to the corresponding word line for writing; and a gate of the MOS transistor for reading is connected to the corresponding word line for readings.

According to still another aspect of the present invention, a non-volatile semiconductor memory device, comprises:

a memory cell having an MOS transistor for writing and a split gate type MFS transistor provided with a first gate having a ferroelectric film above the channel region and a second gate having an insulating film, one of a drain and a source of the MFS transistor having a common electric potential;

a bit line for writing, to which the first gate of the MFS transistor is connected through the transistor for writing, and to which multivalued data having at least three voltage levels or analog data is input;

a bit line for reading, to which the other of the drain and the source of the MFS transistor, and from which the multivalued data having at least three voltage levels or analog data is read;

a word line for writing connected to a gate of the MOS transistor for writing; and a word line for reading connected to the second gate of the MFS transistor.

According to still another aspect of the present invention, a non-volatile semiconductor memory device, comprises:

a plurality of word lines for writing and a plurality of word lines for reading arranged in parallel with each other in a row direction;

a plurality of bit lines for writing, to which multivalued data having at least three voltage levels or analog data is input, and a plurality of bit lines for reading, from which multivalued data having at least three voltage levels or analog data is read, the plurality of bit lines for writing and the plurality of bit lines for reading being arranged in parallel with each other in a column direction;

row scanning means for successively activating the word lines for writing or the word lines for reading in the respective rows in an alternative manner;

column scanning means for successively connecting the bit lines for writing or the bit lines for reading in the respective columns to an input data line or an output data line, while any one of the word lines for writing or any one of the word lines for reading is activated by the row scanning means; and memory cells arranged in a matrix in each crossed portion of one pair of the word line for writing and the word line for reading and one pair of the bit line for writing and the bit line for reading, wherein each of the memory cells has an MOS transistor for writing and a split gate type MFS transistor provided with a first gate having a ferroelectric film above a channel region and a second gate having an insulating film;

one of a drain and a source of the MFS transistor has a common electric potential;

the first gate of the MFS transistor is connected to the corresponding bit line for writing through the MOS transistor for writing;

the other of the drain and the source of the MFS transistor is connected to the corresponding bit line for reading;

a gate of the MOS transistor for writing is connected to the corresponding word line for writing; and the second gate of the MFS transistor is connected to the corresponding word line for reading.

According to the present invention, multivalued data or analog data is input to the bit lines for writing. Under this condition, the word lines for writing are activated. Due to this, the MOS transistor for writing is turned ON and a voltage depending upon the input data is applied to the gate of the MFS transistor. In the meantime, the ferroelectric film of the MFS transistor is polarized in accordance with the applied voltage. Even after the applied voltage is removed, polarization remains in the ferroelectric film (residual polarization). Thus, the multivalued data or analog data can be stored in the memory cell in a non-volatile manner as the residual polarization of the ferroelectric film of the MFS transistor. Further, according to the present invention, the write speed is high.

When the word lines for reading are activated to turn on the MOS transistor for reading under the condition that a voltage is applied to the bit lines for reading, a current depending upon the residual polarization of the ferroelectric film flows through the MFS transistor. By detecting the level of the current, the multivalued data or analog data stored in the memory cell can be read.

When the common electric potential of the gate of the MFS transistor is made a high potential with an inverted polarity, the ferroelectric film is polarized in the opposite direction and is saturated. Thus, the stored data is erased and the memory cell is prepared for storing new data.

Further, in the case of the MFS transistor being of a split gate type, each memory cell has two transistors (the above-mentioned MOS transistor for reading is omitted). Therefore, such an MFS transistor contributes to the high density of a non-volatile semiconductor memory device.

Still further, according to the present invention, data is written in or read from each memory cell by successively selecting one of the memory cells arranged in a matrix by a column scanning circuit and a row scanning circuit. Therefore, a non-volatile semiconductor memory device suitable for an FIFO memory, a video field memory, etc., in which analog data in particular is sequentially accessed, can be provided.

Thus, the invention described herein makes possible the advantages of (1) providing a non-volatile semiconductor memory device in which multivalued data or analog data can be directly stored in each memory cell at a high write speed; (2) providing a non-volatile semiconductor memory device having a large memory capacity per unit area, in which multivalued data or analog data can be directly stored in each memory cell at a high write speed; and (3) providing a non-volatile semiconductor memory device which is sequentially accessible, in which multivalued data or analog data can be directly stored in each memory cell at a high write speed.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the drawings.

Example 1

Figure 1:
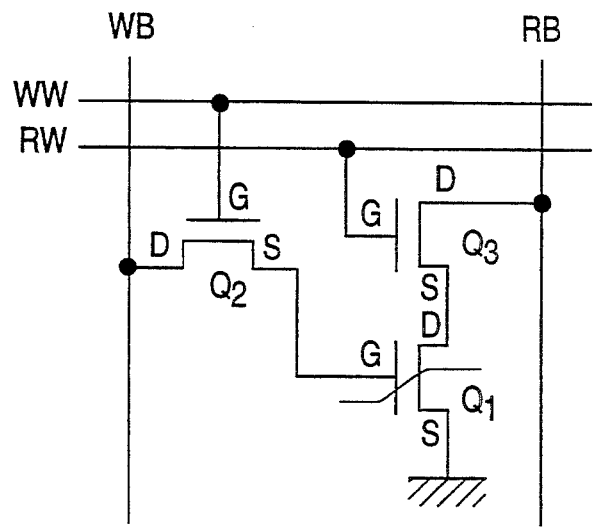
FIG. 1 is a circuit diagram of a memory cell in a first example according to the present invention.

As shown in FIG. 1, a memory cell of a non-volatile semiconductor memory device of the present example includes an MFS transistor: $Q_1$, an MOS transistor $Q_2$ for writing (hereinafter, referred to as a writing transistor), and an MOS transistor $Q_3$ for reading (hereafter, referred to as a reading transistor). A gate G Of the MFS transistor $Q_1$ is connected to a bit line WB for writing (hereinafter, referred to as a writing bit line) through a source 8 and a drain D of the writing transistor $Q_2$. A drain D of the MFS transistor $Q_1$ is connected to a bit line RB for reading (hereinafter, referred to as a reading bit line) through a source S and a drain D of the reading transistor $Q_3$. A source S of the MFS transistor $Q_1$ is connected to common ground. A gate G of the writing transistor $Q_2$ is connected to a word line WW for writing (hereinafter, referred to as a writing word line), and a gate G of the reading transistor $Q_3$ is connected to a word line RW for reading (hereinafter, referred to as a reading word line).

The writing word line WW works for selecting a memory cell in a write state, and the reading word line RW works for selecting a memory cell in a read state. Both of the writing word Line WW and the reading word line RW are activated with a negative voltage. Analog data to be written is input to the writing bit line WB, and analog data stored in the memory cell is read from the reading bit line RB.

Figure 2:
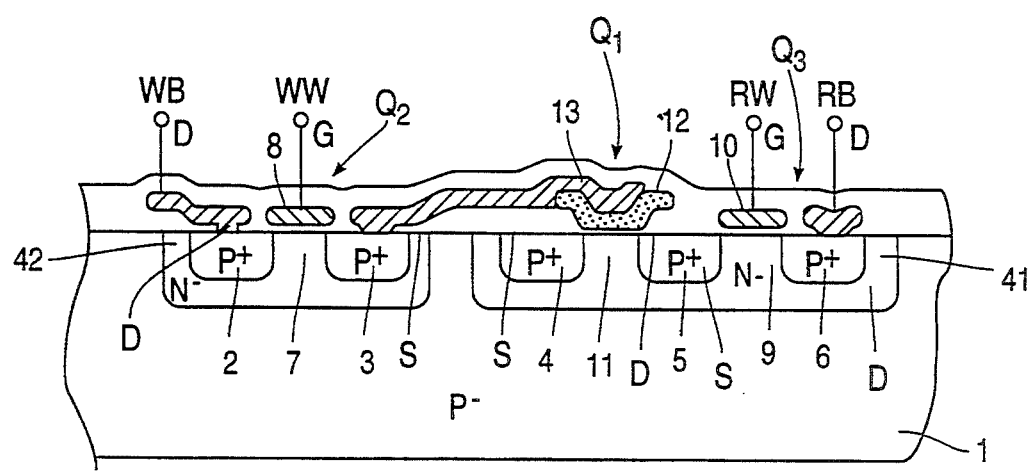
FIG. 2 is a partial cross-sectional view of a semiconductor memory device, showing a structure of the memory cell in the first example according to the present invention.
Figure 11:
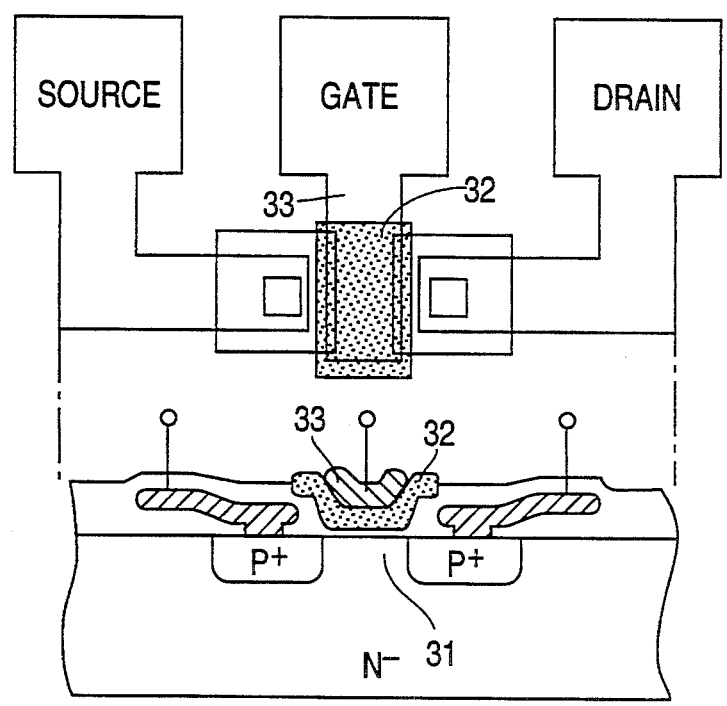
FIG. 11 is a plan view and a cross-sectional view of a semiconductor memory device, showing a structure of an MFS transistor.

The MFS transistor $Q_1$ uses a ferroelectric material in the similar structure to that shown in FIG. 11. The writing transistor $Q_2$ and the reading transistor $Q_3$ are p-channel MOS transistors. The memory cell shown in FIG. 1 is constituted by an integrated circuit as shown in FIG. 2. Namely, two N$^-$-type wells 41 and 42 are provided in an upper region of a P$^-$-type silicon substrate 1. In the N$^-$-type well 41, three P$^+$-type regions 4, 5, and 6 are provided, and in the N$^-$-type well 42, two P$^+$-type regions 2 and 3 are provided. The drain D and the source S of the writing transistor $Q_2$ are formed on the P$^+$-type regions 2 and 3, respectively; the source S and the drain D of the MFS transistor $Q_1$ is formed on the P$^+$-type regions 4 and 5, respectively; and the source S and the drain D of the reading transistor $Q_3$ are formed on the P$^+$-type regions 5 and 6, respectively. A gate electrode 8 is provided above a P-channel region 7 between the P$^+$-type regions 2 and 3, a gate oxide film being formed between the gate electrode 8 and the P-channel region 7, thereby forming the gate G of the writing transistor $Q_2$. A gate electrode 10 is provided above a P-channel region 9, a gate oxide film being formed between the gate electrode 10 and the P-channel region 9, thereby forming the gate G of the reading transistor $Q_3$. A gate electrode 13 is provided above a P-channel region 11 between the P$^+$-type regions 4 and 5, a gate oxide film and a ferroelectric film 12 being formed between the gate electrode 13 and the P-channel region 11, thereby forming the gaze G of the MFS transistor $Q_1$. The gate electrode 13 is connected to the P$^+$-type region 3 constituting the source S of the writing transistor $Q_2$.

The P$^-$-type silicon substrate 1 has p-type impurities, for example, with a concentration of about $10^{14}$ cm$^{-3}$, and the N$^-$-type wells 41 and 42 have N-type impurities, for example, with a concentration of about $10^{16}$ cm$^{-3}$. The P$^+$-type regions 2 to 6 are doped with P-type impurities in high concentration. For example, the P$^+$-type regions 2 to 6 are formed to a depth of about 0.5 $\mu$m to 2 $\mu$m. The ferroelectric film 12 is obtained by sputtering a ferroelectrtc material such as PLZT ((Pb, La)(Zr, Ti)O$_3$) and lead titanate (PbTiO$_3$), for example, to a thickness of about 100 to 500 Å on the gate oxide film. The ferroelectric film 12 may be directly formed on the N$^-$-type well 41 without the gate oxide film therebetween. The gate electrodes 8 and 10 of the writing transistor $Q_2$ and the reading transistor $Q_3$ are made of a polysilicon film, and the gate electrode 13 of the MFS transistor $Q_1$ is made of an aluminum film.

Figure 3:
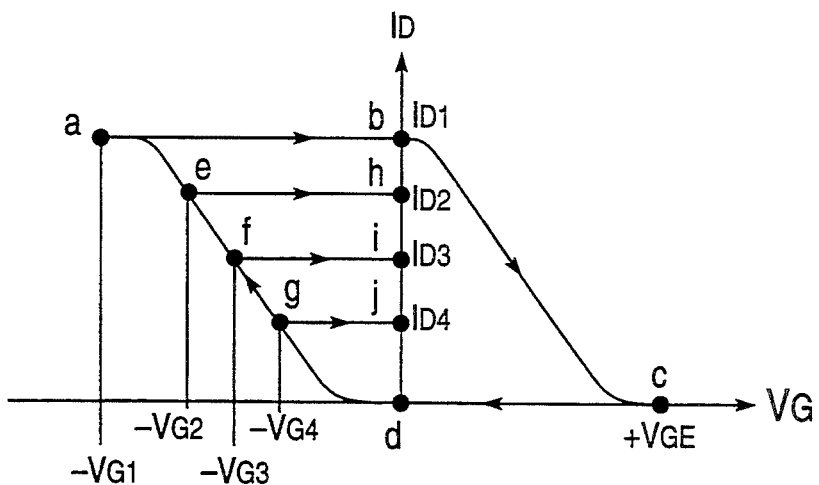
FIG. 3 a graph showing the relationship between the gate voltage and the drain current of an MFS transistor in the first example according to the present invention.

When a positive or negative gate voltage is applied to the gate G of the MFS transistor $Q_1$, the ferroelectric film 12 is polarized. The relationship between the gate voltage and the drain current will have a hysteresis characteristic. For this reason, as shown in FIG. 3, when a sufficiently high negative gate voltage $V_{G1}$ (e.g., about $-20$ V) is applied to the gate G of the MFS transistor $Q_1$, a large drain current $I_{D1}$ flows between the drain D and the source thereof in the same way as in the conventional P-channel MOS transistor and the polarization of the ferroelectric film 12 is saturated ( point a of FIG. 3). Thereafter, when the negative gate voltage $V_{G1}$ is removed, the residual polarization is caused in the ferroelectric film 12 due to the hysteresis characteristic, maintaining the drain current $I_{D1}$ at almost the same level (point b of FIG. 3) as that at the time of saturation. When a positive gate voltage $V_{GE}$ (e.g., about +10 V) is then applied to the gate G of the MFS transistor $Q_1$, the drain current $I_D$ stops flowing and the ferroelectric film 12 is polarized to the opposite state (i.e., positive polarity). Even after the positive gate voltage $V_{GE}$ is removed, a state where the drain current $I_D$ does not flow is kept (point d of FIG. 3).

Thus, binary data can be stored in a non-volatile manner, utilizing the polarity of the residual polarization caused in the ferroelectric film 12 as follows:

The positive gate voltage $V_{GE}$ is applied to the gate Q of the MFS transistor $Q_1$ to saturate the polarization of the ferroelectric film 12 into a positive polarity. Then, depending upon data, it is selected whether or not the polarization is saturated into a negative polarity by applying the negative gate voltage $V_{G1}$. In the case where the polarization is saturated, residual polarization is caused.

Binary data can be read by applying a voltage across the drain D and the source S of the MFS transistor $Q_1$ and then detecting whether the drain current $I_D$ caused by the residual polarization flows therebetween or not.

The negative gate voltages $VG_2$, $VG_3$, and $VG_4$ are respectively applied to the gate G of the MFS transistor $Q_1$ after the application of the positive gate voltage $V_{GE}$. When the negative gate voltage $V_{G2}$ (point e) is applied (in this case, the polarization is not saturated), residual polarization is caused in the ferroelectric film 12 even after the negative gate voltage $V_{G2}$ is removed, and the level of the drain current $I_{D2}$ remains at a point h. When the negative gate voltage $V_{G3}$ (point f) is applied (in this case, the polarization is not saturated), residual polarization is caused in the ferroelectric film 12 even after the gate voltage $V_{G3}$ is removed, and the level of the drain current $I_{D3}$ remains at a point i. When the negative gate voltage $V_{G4}$ (point g) is applied (in this case, the polarization is not saturated), residual polarization is caused in the ferroelectric film 12 even after the gate voltage $V_{GE}$ is removed, and the level of the drain current $I_{D4}$ remains at a point j. Accordingly, the drain current to be maintained is different, depending upon the negative gate voltage to be applied after the application of the positive gate voltage.

A region where the gate voltage $V_G$ is in proportion to the drain current $I_D$ exists. Therefore, analog data or multivalued data can be stored in a non-volatile manner by applying the gate voltage $V_G$ to the gate G of the MFS transistor $Q_1$ as an input signal, and detecting the level of the drain current $I_D$ obtained after the application of the negative gate voltage.

Each operation of erase, write, and read of data in the memory cell with the above structure will be described.

Data is erased as follows: A voltage of O V and a negative voltage VGE are applied to the writing bit line WB and the N$^-$-type well 41, respectively. Under this condition, the writing word line WW is activated (negative voltage). The writing transistor $Q_2$ is turned ON, and a positive gate voltage $V_{GE}$ is applied to the ferroelectric film 12 of the MFS transistor $Q_1$. The ferroelectric film 12 has its polarization saturated into a positive polarity, resulting in the state where the drain current $I_D$ does not flow. The drain current $I_D$ still does not flow even after the positive gate voltage $V_{GE}$ is removed. This state is an initialization state of the memory cell.

Data is written as follows: A voltage of O V and a negative voltage of analog data are applied to the N$^-$-type well 41 and the writing bit line WB, respectively. Under this condition, the writing word line WW is activated (negative voltage). The writing transistor $Q_2$ is turned ON, and the negative gate voltage $V_G$ depending upon the analog data is applied to the ferroelectric film 12 of the MFS transistor $Q_1$. As a result, residual polarization depending upon the analog data is caused in the ferroelectric film 12. Thus, the analog data can be stored in a non-volatile manner. Unlike the injection of electrons into a floating gate, this write operation is performed at a high speed without fail. However, data cannot be overwritten. That is, the memory cell should be initialized by performing the erase operation before the write operation.

The data thus written is read as follows: A sense voltage is applied to the reading bit line RB. Under this condition, the writing word line WW is deactivated (O V), and the reading word line RW is activated (negative voltage). The reading transistor $Q_3$ is turned ON, and the drain current $I_D$ depending upon residual polarization of the ferroelectric film 12 flows between the drain D and the source S of the MFS transistor $Q_1$. Therefore, the stored data can be read by detecting the level of the drain current $I_D$. In this case, since data is not destructively read, rewrite of the data is not required.

According to the non-volatile semiconductor memory device of the present invention, analog data can be directly stored in the memory cell using the MFS transistor $Q_1$ which can be accessible at a high speed and which does not require a power supply for maintaining stored data.

The analog data can be written in the memory cell after its level is appropriately corrected depending upon the characteristic of the ferroelectric film 12 of the MFS transistor $Q_1$. From the analog data which is read, original analog data can be recovered by polarization inversion or correction if needed.

Example 2

Figure 4:
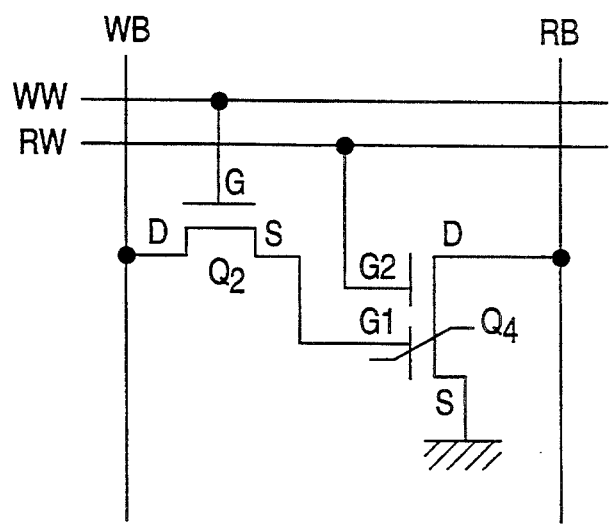
FIG. 4 is a circuit diagram for a memory cell in a second example according to the present invention.
Figure 5:
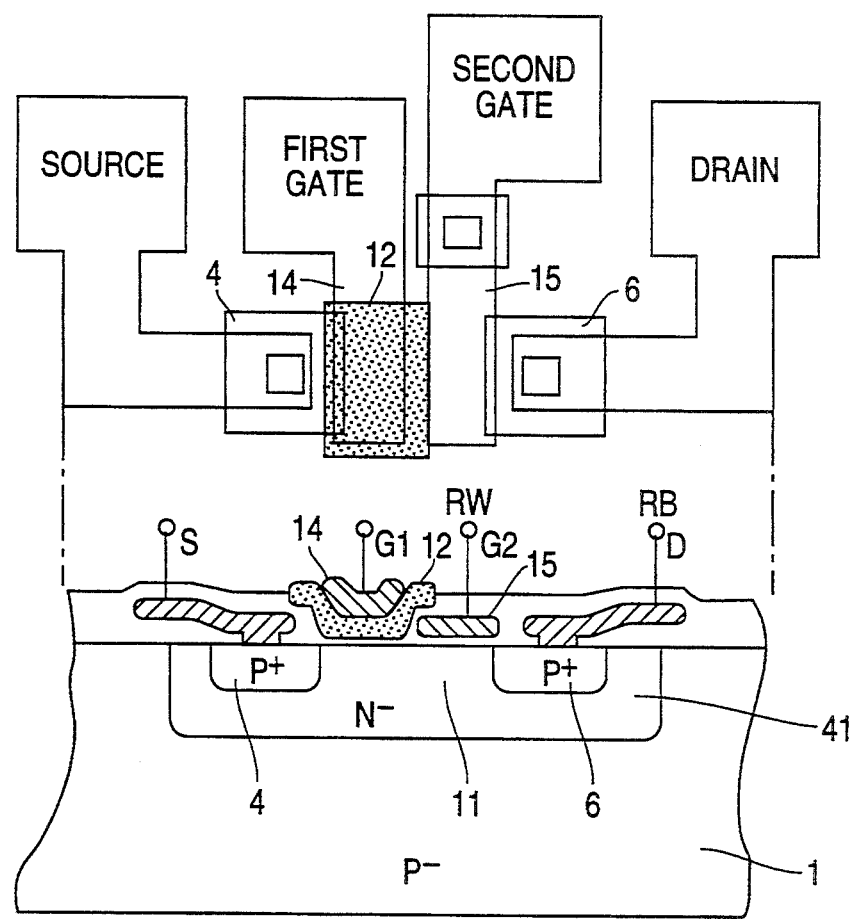
FIG. 5 is a partial cross-sectional view of a semiconductor memory device, showing a structure of a split gate type MFS transistor in the second example according to the present invention.

FIGS. 4 and 5 show a non-volatile semiconductor memory device of the second example according to the present invention. The identical components to those in Example 1 bear the identical reference numerals thereto. The description thereof will be omitted here.

As shown in FIG. 4, a memory cell of the non-volatile semiconductor memory device of the present example includes a split gate type MFS transistor $Q_4$ and the writing transistor $Q_2$. The split gate type MFS transistor $Q_4$ is connected to the writing bit line WB through the source S and the drain D of the writing transistor $Q_2$. A second gate $G_2$ of the split gate type MFS transistor $Q_4$ is connected to the reading word line RW, the drain D thereof is connected to the reading bit line RB, and the source S is connected to the common ground. The gate G of the writing transistor $Q_2$ is connected to the writing word line WW.

The split gate type MFS transistor $Q_4$ has a structure in which the MFS transistor $Q_1$ is combined with the reading transistor $Q_3$ shown in FIG. 1. As shown in FIG. 5, a first gate electrode 14 is provided above the N$^-$-type well 41. A gate oxide film and the ferroelectric film 12 are formed between the first gate electrode 14 and the N$^-$-type well 41. A second gate electrode 15 is provided above the N$^-$-type well 41. Only a gate oxide film is formed between the second gate electrode 15 and the N⁻-type well 41.

In the case of the MFS transistor $Q_4$, a hysteresis characteristic as shown in FIG. 3 is present between the first gate voltage $V_G$ to be applied to the first gate $G_1$ and the drain current $I_D$ flowing between the drain D and the source S of the MFS transistor $Q_4$. Thus, analog data or multivalued data can be stored in a non-volatile manner. The erase, write, and read of data in the memory cell with the above structure are the same as those of Example 1.

In the present example, analog data can also be written in the memory cell using the split gate type MFS transistor $Q_4$ which is accessible at a high speed and which does not require a power supply for maintaining stored data.

Example 3

Figure 6:
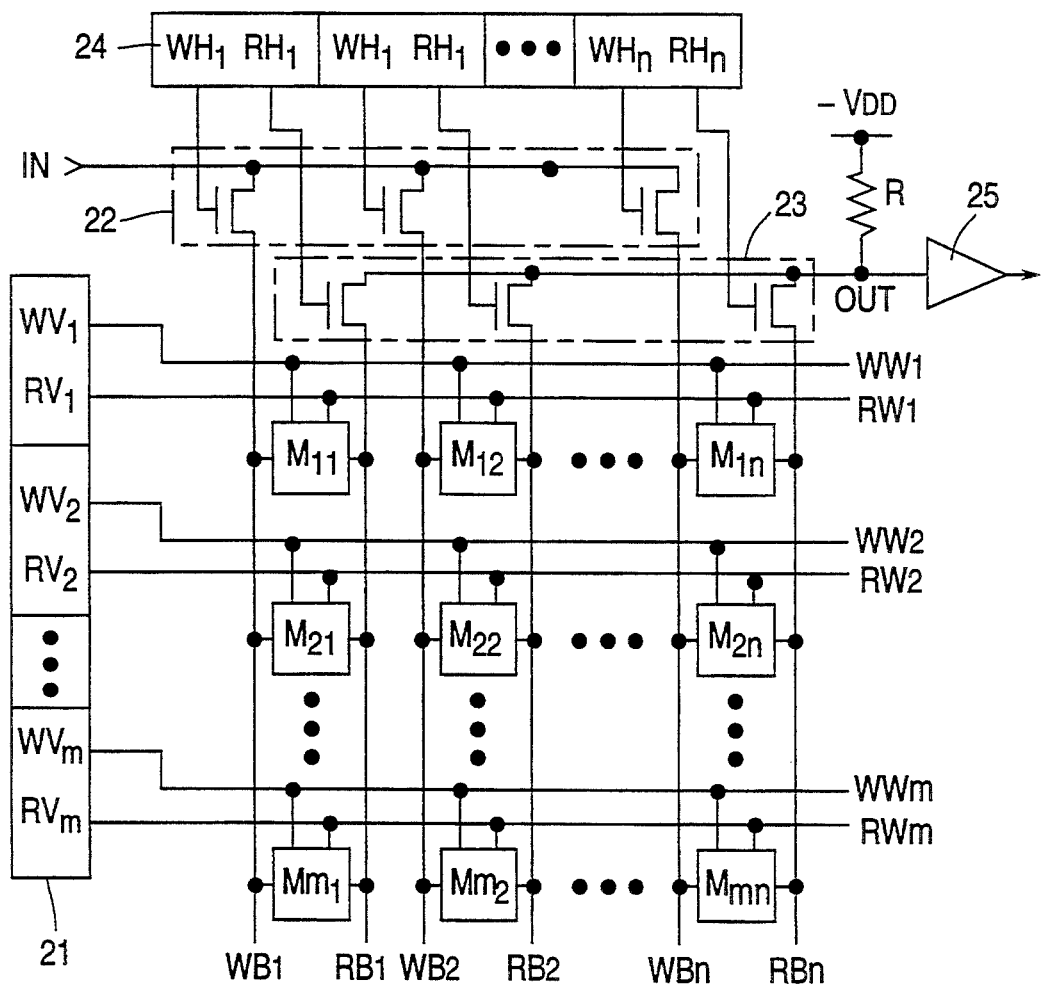
FIG. 6 is a block diagram showing a structure of a non-volatile image memory device in a third example according to the present invention.

FIGS. 6 to 9 show a non-volatile image memory device of the third example according to the present invention. As shown in FIG. 6, in the non-volatile image memory device of the present example, word lines $WW_1$ to $WW_m$ for writing (hereinafter, referred to as writing word lines) and word lines $RW_1$ to $RW_m$ for reading (reading word lines) are provided so as to cross bit lines $WB_1$ to $WB_n$ for writing (hereinafter, referred to as writing bit lines) and bit lines $RB_1$ and $RB_n$ for reading (hereinafter, referred to as reading bit lines). At crossed sections, memory cells $M_{11}$ to $M_{mn}$ of the first example or the second example are respectively provided. That is, the memory cells $M_{11}$ to $M_{mn}$ are arranged in an (n×m) matrix.

The writing word lines $WW_1$ to $WW_m$ and the reading word lines $RW_1$ to $RW_m$ are to be connected to outputs $WV_1$ to $WV_m$ for writing (hereinafter, referred to as writing outputs) and outputs $RV_1$ to $RV_m$ for reading (hereinafter, referred to as reading outputs) of a vertical scanning shift register 21. The vertical scanning shift register 21 successively shifts a vertical scanning signal. More specifically, in the case of writing data, the vertical scanning shift register 21 activates the writing word lines $WW_1$ to $WW_m$ so as to be connected to the writing outputs $WV_1$ to $WV_m$, one line at a time. In the case of reading data, the vertical scanning shift register 21 activates the reading word lines $RW_1$ to $RW_m$ so as to be connected to the reading outputs $RV_1$ to $RV_m$, one line at a time.

The writing bit lines $WB_1$ to $WB_n$ are to be connected to an input data line IN through each P-channel MOS transistor of the selecting circuit 22 for writing. The reading bit lines $RB_1$ to $RB_n$ are to be connected to an output data line OUT through each P-channel MOS transistor of a selecting circuit 23 for reading. The selecting circuit 22 has the gate of each P-channel MOS transistor thereof connected to outputs $WH_1$ to $WH_n$ for writing (hereafter referred to as writing outputs) of a horizontal scanning shift register 24. In the case of writing data, the horizontal scanning shift register 24 shifts a horizontal scanning signal, thereby activating the writing bit lines $WB_1$ to $WB_n$ so as to be connected to the input data line IN, one line at a time. The selecting circuit 23 has the gate of each P-channel MOS transistor to outputs $RH_1$ to $RH_n$ for reading (hereinafter, referred to as reading outputs) of the horizontal scanning shift register 24. In the case of reading data, the horizontal scanning shift register 24 shifts a horizontal scanning signal, thereby activating the reading bit lines $RB_1$ to $RB_n$ so as to be connected to the output data line OUT for reading, one line at a time.

The output data line OUT is connected to a power supply $-V_{DD}$ through a resistor R and is led outside through a polarization inverter 25.

The operation of the non-volatile image memory device with the above structure will be described with reference to FIGS. 7 to 9.

Figure 7:
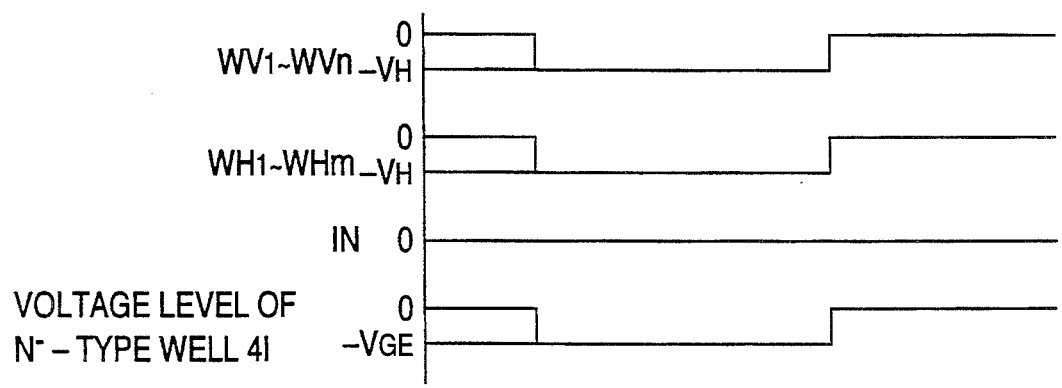
FIG. 7 is a timing chart showing an erase operation for the non-volatile image memory device in the third example according to the present invention.

As shown in FIG. 7, in the case of erasing data, a voltage of 0 V is applied to the input data line IN and a negative voltage $V_G$ is applied to the N⁻-type well 41. Under this condition, a vertical scanning signal and a horizontal scanning signal are transmitted to the vertical scanning shift register 21 and the horizontal scanning shift register 24 so that outputs for writing are activated. In the meantime, all of the writing bit lines $WB_1$ to $WB_n$ are connected to the input data line IN at 0 V, and all of the writing word lines $WW_1$ to $WW_m$ are activated. Thus, all of the data stored in all of the memory cells $M_{11}$ to $M_{mn}$ are erased.

Figure 8:
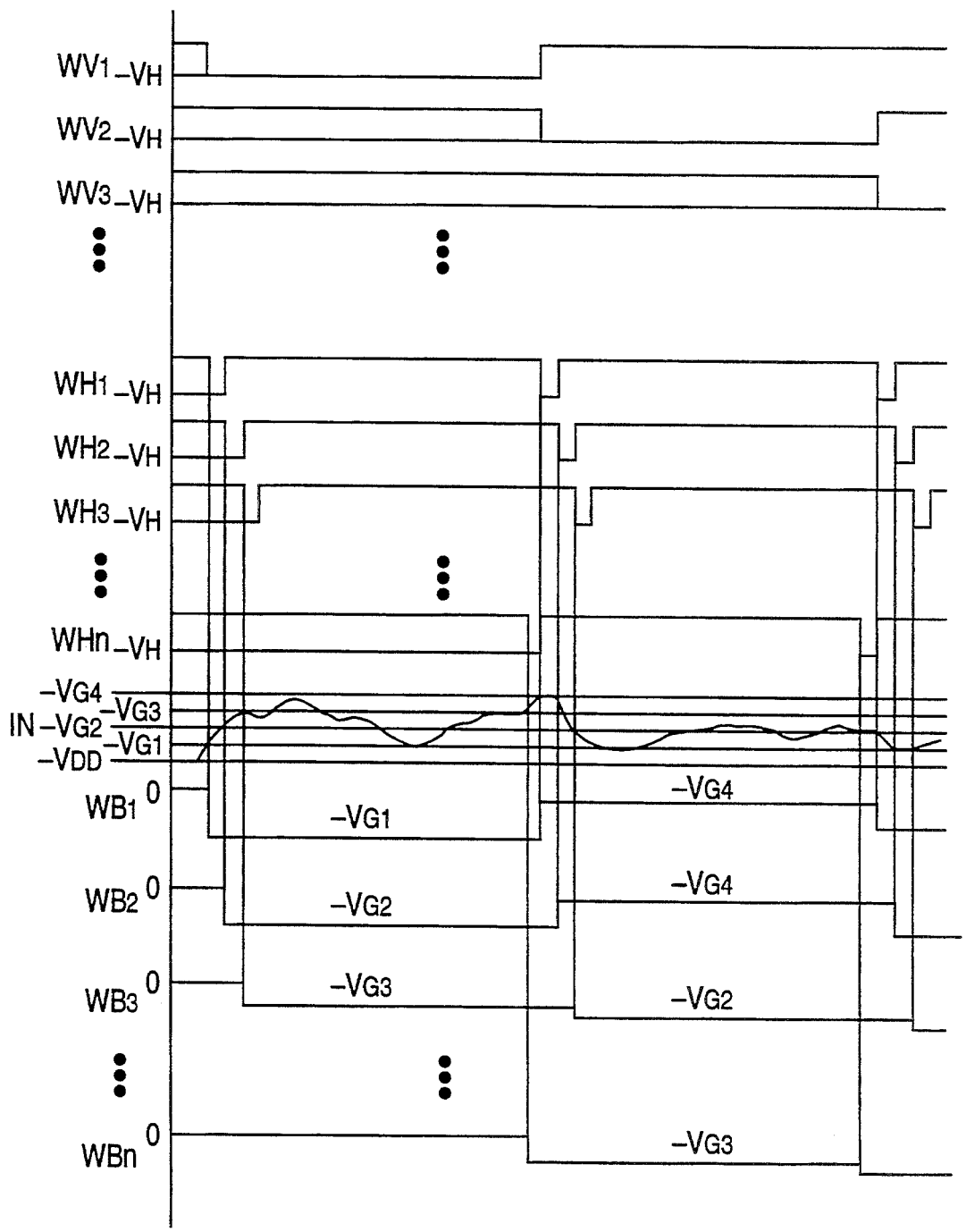
FIG. 8 is a timing chart showing a write operation for the non-volatile image memory device in the third example according to the present invention.

As shown in FIG. 8, in the case of writing data, the N⁻-type well 41 is made 0 V, and image analog data is input to the input data line IN. Under this condition, a vertical scanning signal and a horizontal scanning signal are respectively transmitted to the vertical scanning shift register 21 and the horizontal scanning shift register 24 so that the outputs for writing are activated, one output at a time. In the meantime, the writing outputs $WV_1$ to $WV_m$ of the vertical scanning shift register 21 are activated ($-VH$), one at a time. While the writing our-puts $WV_1$ to $WV_m$ of the vertical scanning shift register 21 are active, the writing outputs $WH_1$ to $WM_n$ of the horizontal scanning shift register 24 are activated ($-VH$). Thus, the writing bit lines $WB_1$ to $WB_n$ are connected to the input data line IN, every time the corresponding writing outputs $WH_1$ to $WM_n$ of the horizontal scanning shift register 24 are activated, whereby analog data is successively sampled. The analog data thus sampled are written in the memory cells $M_{11}$ to $M_{mn}$ on the writing word lines $WW_1$ to $WW_m$ (which are active during this time) connected to the writing outputs $WV_1$ to $WV_m$ of the vertical scanning shift register 21.

Figure 9:
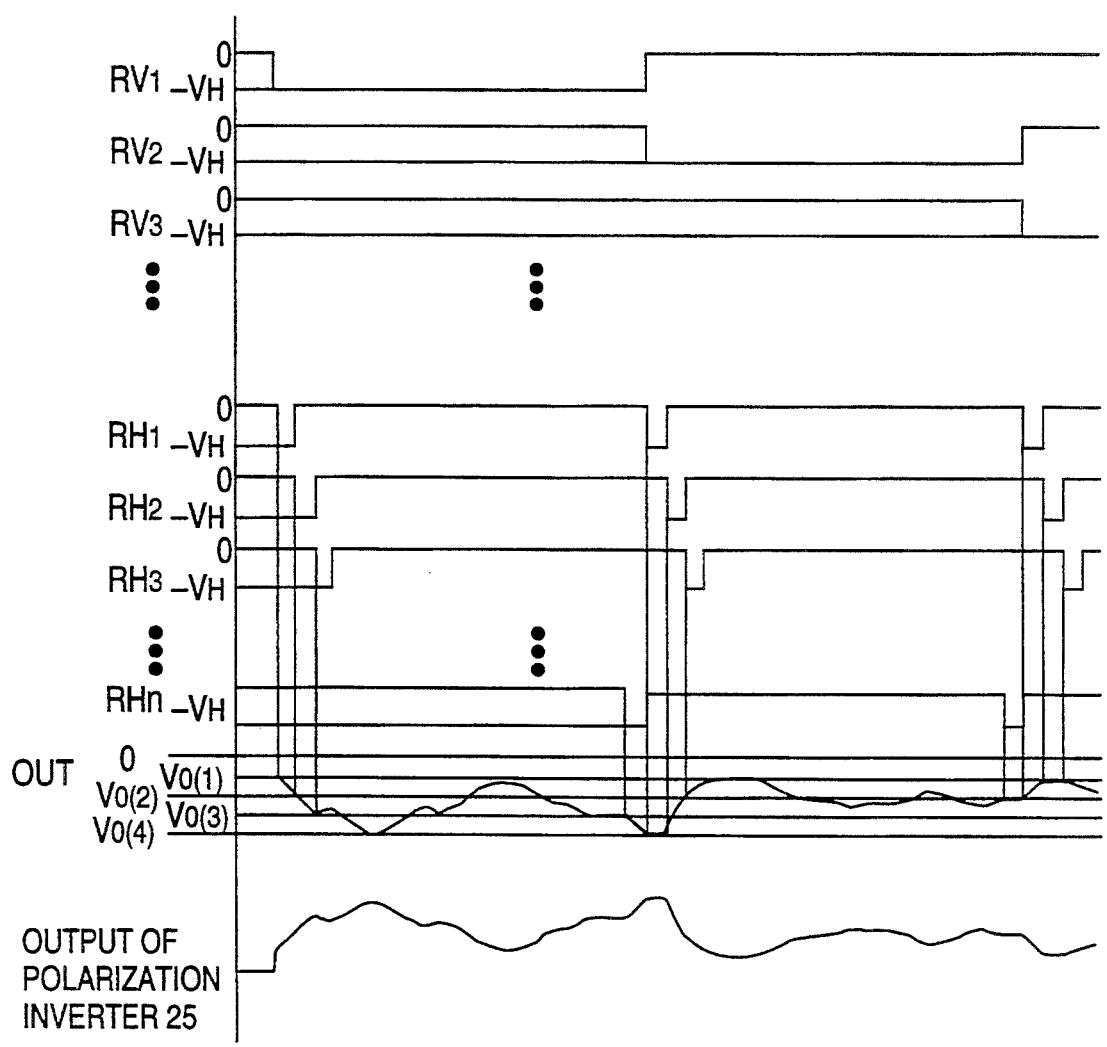
FIG. 9 is a timing chart showing a read operation of the non-volatile image memory device in the third example according to the present invention.
Figure 10:
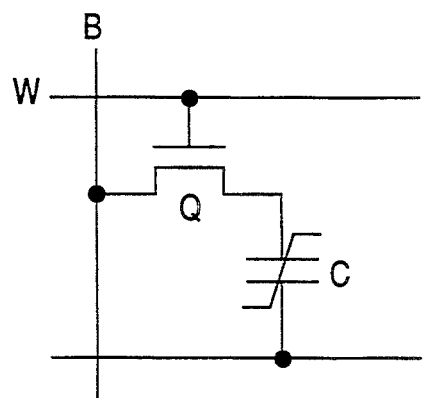
FIG. 10 is a circuit diagram for a memory cell provided with a capacitor for storing data including a ferroelectric material.

As shown in FIG. 9, in the case of reading analog data written as described above, a vertical scanning signal and a horizontal scanning signal are transmitted to the vertical scanning shift register 21 and the horizontal scanning shift register 24 so that the respective outputs for reading are activated, one at a time. The reading outputs $RV_1$ to $RV_m$ of the vertical scanning shift register 21 are activated ($-VH$) one at a time. While one of the reading outputs $RV_1$ to $RV_m$ is activated, the respective reading outputs $RH_1$ to $RH_n$ of the horizontal scanning shift register 24 are successively activated ($-VH$). The reading outputs $RH_1$ to $RH_n$ of the horizontal scanning shift register 24 are activated one at a time. While one of the reading outputs $RE_1$ to $RH_n$ is activated, the respective reading bit lines $RB_1$ to $RB_n$ are successively connected to the output data line OUT. The analog data read from the memory cells $M_{11}$ to $M_{mn}$ on the reading word lines $RW_1$ to $RW_m$ connected to the reading outputs $RV_1$ to $RV_m$ (which are active during this time) of the vertical scanning shift register 21 are successively transmitted to the output line OUT. The analog data transmitted to the output data line OUT has its polarization inverted by the polarization inverter 25 and is output as analog data of an original image.

As described above, according to the non-volatile image memory device of the present example, analog data can be successively stored, one pixel at a time, in the memory cells $M_{11}$ to $M_{mn}$. Further, the stored analog data can be read and output as analog data of an original image.

As is apparent from the above description, according to the present invention, multivalued data or analog data can be directly stored in the memory cells of the non-volatile semiconductor memory device which is accessible at a high speed and which does not require a power supply for maintaining stored data.

Various other modifications will be apparent to and can be readily made by those skilled in the art without departing from the score and spirit of this invention. Accordingly, it is not intended that the scope of the claims appended hereto be limited to the description as set forth herein, but rather that the claims be broadly construed.

What is claimed is:

1. A non-volatile semiconductor memory device, comprising:
    a memory cell including an MOS transistor for reading, an MOS transistor for writing, and an MFS transistor provided with a gate having a ferroelectric film above a channel region, one of a drain and a source of the MFS transistor having a common electric potential;
    a bit line for writing, to which the gate of the MFS transistor is connected through the MOS transistor for writing, and to which multivalued data having at least three voltage levels or analog data is input;
    a bit line for reading, to which the other of the drain and the source of the MFS transistor is connected through the MOS transistor for reading, and from which multivalued data having at least three voltage levels or analog data is read;
    a word line for writing connected to a gate of the MOS transistor for writing; and
    a word line for reading connected to a gate of the MOS transistor for reading.

2. A non-volatile semiconductor memory device, comprising:
    a plurality of word lines for writing and a plurality of word lines for reading arranged in parallel with each other in a row direction;
    a plurality of bit lines for writing, to which multivalued data having at least three voltage levels or analog data is input, and a plurality of bit lines for reading, from which multivalued data having at least three voltage levels or analog data is read, the plurality of bit lines for writing and the plurality of bit lines for reading being arranged in parallel with each other in a column direction;
    row scanning means for successively activating the word lines for writing or the word lines for reading in the respective rows in an alternative manner;
    column scanning means for successively connecting the bit lines for writing or the bit lines for reading in the respective columns to an input data line or an output data line, while any one of the word lines for writing or any one of the word lines for reading is activated by the row scanning means; and
    memory cells arranged in a matrix in each crossed portion of one pair of the word line for writing and the word line for reading and one pair of the bit line for writing, and the bit line for reading,
    wherein each of the memory cells has an MOS transistor for reading, an MOS transistor for writing and an MFS transistor provided with a gate having a ferroelectric film above a channel region;
    one of a drain and a source of the MFS transistor has a common electric potential;
    the gate of the MFS transistor is connected to the corresponding bit line for writing through the MOS transistor for writing;
    the other of the drain and the source of the MFS transistor is connected to the corresponding bit line for reading through the MOS transistor for reading;
    a gate of the MOS transistor for writing is connected to the corresponding word line for writing; and
    a gate of the MOS transistor for reading is connected to the corresponding word line for reading.

3. A non-volatile semiconductor memory device, comprising:
    a memory cell having an MOS transistor for writing and a split gate type MFS transistor provided with a first gate having a ferroelectric film above the channel region and a second gate having an insulating film, one of a drain and a source of the MFS transistor having a common electric potential;
    a bit line for writing, to which the first gate of the MFS transistor is connected through the MOS transistor for writing, and to which multivalued data having at least three voltage levels or analog data is input;
    a bit line for reading, to which the other of the drain and the source of the MFS transistor, and from which the multivalued data having at least three voltage levels or analog data is read;
    a word line for writing connected to a gate of the MOS transistor for writing; and
    a word line for reading connected to the second gate of the MFS transistor.

4. A non-volatile semiconductor memory device, comprising:
    a plurality of word lines for writing and a plurality of word lines for reading arranged in parallel with each other in a row direction;
    a plurality of bit lines for writing, to which multivalued data having at least three voltage levels or analog data is input, and a plurality of bit lines for reading, from which multivalued data having at least three voltage levels or analog data is read, the plurality of bit lines for writing and the plurality of bit lines for reading being arranged in parallel with each other in a column direction;
    row scanning means for successively activating the word lines for writing or the word lines for reading in the respective rows in an alternative manner;
    column scanning means for successively connecting the bit lines for writing or the bit lines for reading in the respective columns to an input data line or an output data line, while any one of the word lines for writing or any one of the word lines for reading is activated by the row scanning means; and
    memory cells arranged in a matrix in each crossed portion of one pair of the word line for writing and the word line for reading and one pair of the bit line for writing, and the bit line for reading,
    wherein each of the memory cells has an MOS transistor for writing and a split gate type MFS transistor provided with a first gate having a ferroelectric film above a channel region and a second gate having an insulating film;

one of a drain and a source of the MFS transistor has a common electric potential;

the first gate of the MFS transistor is connected to the corresponding bit line for writing through the MOS transistor for writing;

the other of the drain and the source of the MFS transistor is connected to the corresponding bit line for reading;

a gate of the MOS transistor for writing is connected to the corresponding word line for writing; and the second gate of the MFS transistor is connected to the corresponding word line for reading.

* * * * *

UNITED STATES PATENT AND TRADEMARK OFFICE
CERTIFICATE OF CORRECTION

PATENT NO. : 5,446,688
DATED : August 29, 1995
INVENTOR(S) : Yasuo Torimaru

It is certified that error appears in the above-indentified patent and that said Letters Patent is hereby corrected as shown below:

In column 1, line 22, please delete ":".

In column 2, line 31, please change ":" to -- ; --.

In column 2, line 38, please change "MOB" to -- MOS --.

In column 2, line 58, please change ":" to -- ; --.

In column 3, line 17, please change "readings" to -- reading --.

In column 3, line 28, please change "the transistor," to -- the MOS transistor --.

In column 3, line 60, please change "one,of" to -- one of --.

In column 5, line 15, please change "FIG. 3 a graph" to -- FIG. 3 is a graph --.

In column 5, line 52, please delete ":".

In column 5, line 54, please change "hereafter" to -- hereinafter --.

In column 5, line 55, please change "Of the" to -- of the --.

In column 5, line 58, please change "source 8" to -- source S --.

UNITED STATES PATENT AND TRADEMARK OFFICE
CERTIFICATE OF CORRECTION

PATENT NO. : 5,446,688
DATED : August 29, 1995
INVENTOR(S) : Yasuo Torimaru

It is certified that error appears in the above-indentified patent and that said Letters Patent is hereby corrected as shown below:

In column 6, line 4, please change "Line WW" to -- line WW --.

In column 6, line 12, please change "p-channel" to -- P-channel --.

In column 6, line 37, please change "gaze G" to -- gate G --.

In column 6, line 41, please change "p-type" to -- P-type --.

In column 6, line 49, please change "ferroelectrtc" to -- ferroelectric --.

In column 6, line 66, please change "source thereof" to -- source S thereof --.

In column 6, line 68, please delete "(".

In column 7, line 1, please change "point a" to -- (point a --.

In column 7, line 16, please change "gate Q" to -- gate G --.

In column 7, line 58, please change "O V" to -- 0 V --.

In column 8, line 3, please change "O V" to -- 0 V --.

In column 8, line 21, please change "(O" to -- (0 --.

UNITED STATES PATENT AND TRADEMARK OFFICE
CERTIFICATE OF CORRECTION

PATENT NO. : 5,446,688
DATED : August 29, 1995
INVENTOR(S) : Yasuo Torimaru

It is certified that error appears in the above-indentified patent and that said Letters Patent is hereby corrected as shown below:

In column 9, line 24, please change "(reading word lines)" to -- (hereinafter, referred to as reading word lines) --.

In column 9, line 55, please change "(hereafter referred to as writing outputs) to -- (hereinafter, referred to as writing outputs) --.

In column 10, line 8, please change "O V" to -- 0 V --.

In column 10, line 16, please change "O V" to -- 0 V --.

In column 10, line 20, please change "O V" to -- 0 V --.

In column 10, line 29, please change "our-puts" to -- outputs --.

In column 10, line 30, please change "WM$_n$" to -- WH$_n$ --.

In column 10, line 32, please change "(-VH) . Thus" to -- (-VH) . Thus --.

In column 10, line 34, please change "WM$_n$" to -- WH$_n$ --.

In column 10, line 55, please change "RE$_1$" to -- RH$_1$ --.

In column 11, line 13, please change "score" to -- scope --.

Signed and Sealed this

Thirteenth Day of February, 1996

Attest:

BRUCE LEHMAN

Attesting Officer

Commissioner of Patents and Trademarks